United States Patent
Sugizaki

(10) Patent No.: US 8,283,737 B2
(45) Date of Patent: Oct. 9, 2012

(54) MEMS PACKAGE AND METHOD OF MANUFACTURING THE MEMS PACKAGE

(75) Inventor: Yoshiaki Sugizaki, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 291 days.

(21) Appl. No.: 12/558,171

(22) Filed: Sep. 11, 2009

(65) Prior Publication Data

US 2010/0127340 A1  May 27, 2010

(30) Foreign Application Priority Data

Nov. 21, 2008  (JP) ................................. 2008-298247

(51) Int. Cl.
  *H01L 29/84* (2006.01)
(52) U.S. Cl. . 257/415; 257/773; 257/778; 257/E29.324; 257/E23.06
(58) Field of Classification Search .................. 257/415, 257/773, 778, E21.499, E23.06, E29.324; 438/51
See application file for complete search history.

(56) References Cited

U.S. PATENT DOCUMENTS

| | | | |
|---|---|---|---|
| 6,808,955 B2 | 10/2004 | Ma | |
| 7,642,657 B2 * | 1/2010 | Suilleabhain et al. | 257/778 |
| 7,897,503 B2 * | 3/2011 | Foster et al. | 438/618 |
| 7,993,950 B2 * | 8/2011 | Lacey et al. | 438/51 |
| 2008/0128901 A1 * | 6/2008 | Zurcher et al. | 257/724 |
| 2008/0261343 A1 * | 10/2008 | Jafri et al. | 438/51 |
| 2009/0127639 A1 * | 5/2009 | Suzuki et al. | 257/415 |
| 2009/0206444 A1 * | 8/2009 | Yamada et al. | 257/506 |
| 2010/0032268 A1 * | 2/2010 | Suilleabhain et al. | 200/181 |
| 2010/0176468 A1 * | 7/2010 | Ishii | 257/417 |

\* cited by examiner

*Primary Examiner* — Allan R Wilson
(74) *Attorney, Agent, or Firm* — Oblon, Spivak, McClelland, Maier & Neustadt, L.L.P.

(57) ABSTRACT

An MEMS chip is mounted face-down on a semiconductor wafer such that a movable section is opposed to the semiconductor wafer. A resin layer is formed on the semiconductor wafer around the MEMS chip to reduce a step between the MEMS chip and the semiconductor wafer. After the semiconductor substrate is removed, the land electrode is formed on the resin layer.

9 Claims, 17 Drawing Sheets

MEMS PACKAGE AND METHOD OF MANUFACTURING THE MEMS PACKAGE

CROSS-REFERENCE TO RELATED APPLICATIONS

This application is based upon and claims the benefit of priority from the prior Japanese Patent Application No. 2008-298247, filed on Nov. 21, 2008; the entire contents of which are incorporated herein by reference.

BACKGROUND

U.S. Pat. No. 6,808,955 discloses a method of mounting, in connecting an MEMS chip and an IC chip, the MEMS chip face-down on the IC chip to reduce a wiring path between the MEMS chip and the IC chip.

However, in the method disclosed in U.S. Pat. No. 6,808,955, because the MEMS chip is mounted face-down on the IC chip, a wire cannot be directly connected from the MEMS chip to the outside of a package. To connect the wire from the MEMS chip to the outside of the package, the wire needs to be connected through the IC chip. Therefore, parasitic capacitance is formed between the MEMS chip and the IC chip and noise is caused between the MEMS chip and the IC chip. As a result, it is difficult to handle a high-speed signal and an analog signal.

Further, in the method disclosed in U.S. Pat. No. 6,808,955, because the MEMS chip is mounted face-down on the IC chip, the IC chip cannot be flip-chip mounted on a mother board. To connect a wire from the IC chip to the outside of the package, wire bonding needs to be used. Therefore, parasitic inductance increases and characteristic impedance cannot be matched. As a result, it is more difficult to handle a high-speed signal and an analog signal.

SUMMARY

A method of manufacturing an MEMS package according to an embodiment of the present invention comprises: mounting an MEMS chip, in which a movable section and a first electrode and a second electrode electrically connected to the movable section are formed above a substrate via an insulating layer, on a wafer via a first protruding electrode with the movable section facing to the wafer and electrically connecting the first electrode of the MEMS chip and a first pad electrode of the wafer; forming a first resin layer on the wafer around the MEMS chip to reduce a step between the MEMS chip and the wafer; removing the substrate from the insulating layer after thinning the first resin layer together with the substrate; removing at least a part of the insulating layer to expose the second electrode of the MEMS chip; and forming, on the first resin layer, a first land electrode connected to the second electrode of the MEMS chip and a second land electrode connected to the second pad electrode on the wafer.

A method of manufacturing an MEMS package according to an embodiment of the present invention comprises: mounting an MEMS chip, in which a movable section and a first electrode and a second electrode electrically connected to the movable section are formed above a substrate via an insulating layer, on a wafer via a first protruding electrode with the movable section facing to the wafer and electrically connecting the first electrode of the MEMS chip and a first pad electrode of the wafer; forming a first resin layer on the wafer around the MEMS chip to reduce a step between the MEMS chip and the wafer; filling a first resin layer in a gap between the MEMS chip and the wafer; removing the substrate from the insulating layer after filling the first resin layer in the gap; forming a second resin layer on the MEMS chip and on the wafer around the MEMS chip to reduce a step between the MEMS chip, from which the substrate is removed, and the wafer; forming, in the second resin layer, an opening for exposing the second electrode of the MEMS chip and a second pad electrode on the wafer; and forming, on the second resin layer, a first land electrode connected to the second electrode of the MEMS chip and a second land electrode connected to the second pad electrode on the wafer.

A method of manufacturing an MEMS package according to an embodiment of the present invention comprises: a semiconductor chip on which a semiconductor element and a first pad electrode are formed; a movable section formed above an insulating layer; first and second electrodes electrically connected to the movable section formed above the insulating layer and capable of supplying a driving signal when necessary; a first protruding electrode formed on the first electrode, the first protruding electrode connecting the first pad electrode and the first electrode; and a first land electrode connected to a rear surface of the second electrode via a first opening formed in the insulating layer.

DETAILED DESCRIPTION OF THE INVENTION

Exemplary embodiments of the present invention are explained in detail below with reference to the accompanying drawings. The present invention is not limited by the embodiments.

FIGS. 1 to 7 are sectional views of a method of manufacturing an MEMS package according to a first embodiment of the present invention.

Figure 1:
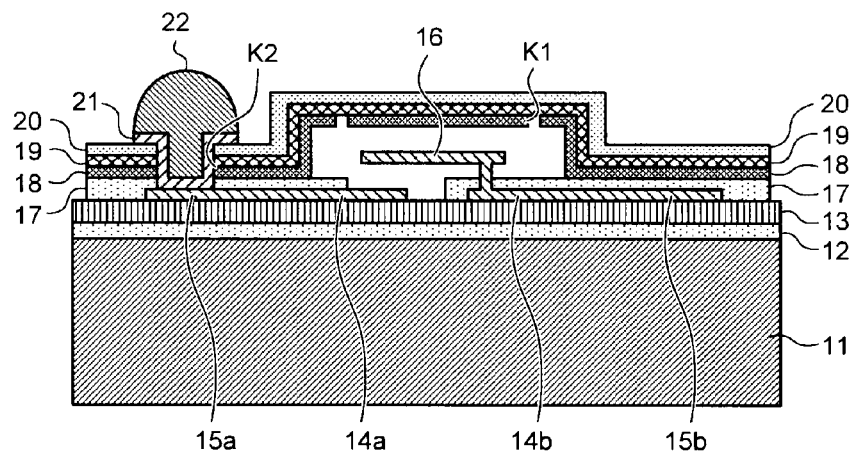
FIGS. 1, 2A, 2B, 3A, 3B, 4A, 4B, 5A, 5B, 6A, 6B and 7 are sectional views of the method of manufacturing an MEMS package according to the first embodiment.

In FIG. 1, a semiconductor substrate 11 is provided in an MEMS chip. Insulating films 12 and 13 are sequentially formed on the semiconductor substrate 11. The material of the semiconductor substrate 11 can be selected out of, for example, Si, Ge, SiGe, SiC, SiSn, PbS, GaAs, InP, Gap, GaN, ZnSe, and GaInAsP. The resistance of the semiconductor substrate 11 is not limited to a specific value and can be an arbitrary value.

The material and the thickness of the insulating films 12 and 13 can be set to prevent the insulating films 12 and 13 from bending because of the own weight of the insulating films 12 and 13, the weight of a movable section 16, and the like when the semiconductor substrate 11 is removed. For example, a silicon nitride film having thickness equal to or smaller than 1 micrometer can be used as the insulating film 12. A silicon oxide film having thickness equal to or larger than 1 micrometer can be used as the insulting film 13. The insulating films 12 and 13 can be formed by the chemical vapor deposition (CVD) method.

Wires 14a and 14b and electrodes 15a and 15b are formed on the insulating film 13. The wires 14a and 14b are respectively connected to the electrodes 15a and 15b. The movable section 16 separated from the wire 14a is formed on the wire 14a. The movable section 16 is connected to the wire 14b. The wires 14a and 14b and the electrodes 15a and 15b can be formed by using a lower metal layer. The movable section 16 can be formed by using an upper metal layer. As the material of the wires 14a and 14b, the electrode 15a and 15b, and the movable section 16, for example, Al or Cu can be used.

An interlayer insulating film 17 is formed on the wires 14a and 14b and the electrodes 15a and 15b. Cap layers 18 and 19 and an organic coating layer 20 separated from the movable section 16 are sequentially laminated on the interlayer insulating film 17 and the movable section 16. Openings K1 for removing a sacrificial layer for forming a hollow around the movable section 16 are formed in the cap layer 18. The interlayer insulating film 17 and the cap layers 18 and 19 can be formed by the CVD method. The organic coating layer 20 can be formed by the spin coat method.

An opening K2 for exposing the front surface of the electrode 15a is formed in the interlayer insulating film 17, the cap layers 18 and 19, and the organic coating layer 20. A base metal layer 21 is formed on the front surface of the electrode 15a and the sidewall of the opening K2. The base metal layer 21 can also function as a seed electrode. As the base metal layer 2, a single layer or a laminated film containing, for example, Ti, Cu, Ni, Au, or Pd as a main component can be used.

A protruding electrode 22 embedded in the opening K2 via the base metal layer 21 and protruding onto the organic coating layer 20 is formed on the electrode 15a. The height of the protruding electrode 22 can be set such that the tip of the protruding electrode 22 is located above the organic coating layer 20 on the movable section 16. As the protruding electrode 22, for example, a solder ball, an Au bump, or a Cu bump or a Ni bump coated with a solder material or the like can be used. As a method of forming the protruding electrode 22, electrolytic plating, solder printing, or a method of mounting a solder ball can be used.

Figure 2A:

On the other hand, as shown in FIG. 2A, pad electrodes 33a and 33b are formed, via an insulating layer 32, on a semiconductor wafer 31 on which a semiconductor element is formed. A protective film 34 is formed on the insulating layer 32 and the pad electrodes 33a and 33b. The material of the semiconductor wafer 31 can be selected out of, for example, Si, Ge, SiGe, SiC, SiSn, PbS, GaAs, InP, GaP, GaN, ZnSe, and GaInAsP. An integrated circuit or the like can be formed on the semiconductor wafer 31 by using the semiconductor element formed on the semiconductor wafer 31. Openings K11 and K12 for respectively exposing the front surfaces of the pad electrodes 33a and 33b are formed in the protective film 34.

Figure 2B:
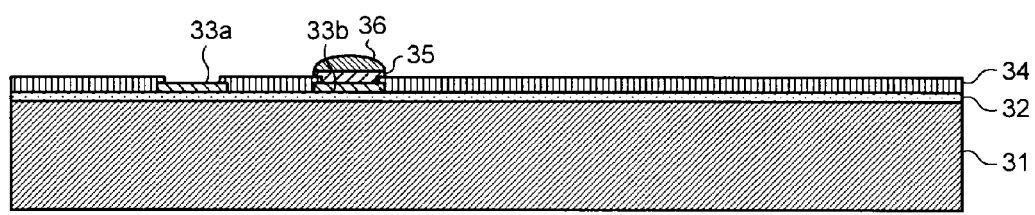

As shown in FIG. 2B, a protruding electrode 36 is formed on the pad electrode 33b via a base metal layer 35. As the base metal layer 35, a single layer or a laminated layer containing, for example, Ti, Cu, Ni, or Pd as a main component can be used. As the protruding electrode 36, for example, a solder ball, an Au bump, or a Cu bump or a Ni bump coated with a solder material or the like can be used. As a method of forming the protruding electrode 36, electrolytic plating, solder printing, or a method of mounting a solder ball can be used. Whichever of the structure shown in FIG. 1 and the structure shown in FIG. 2B can be formed earlier. The order of forming the structures does not matter.

Figure 3A:
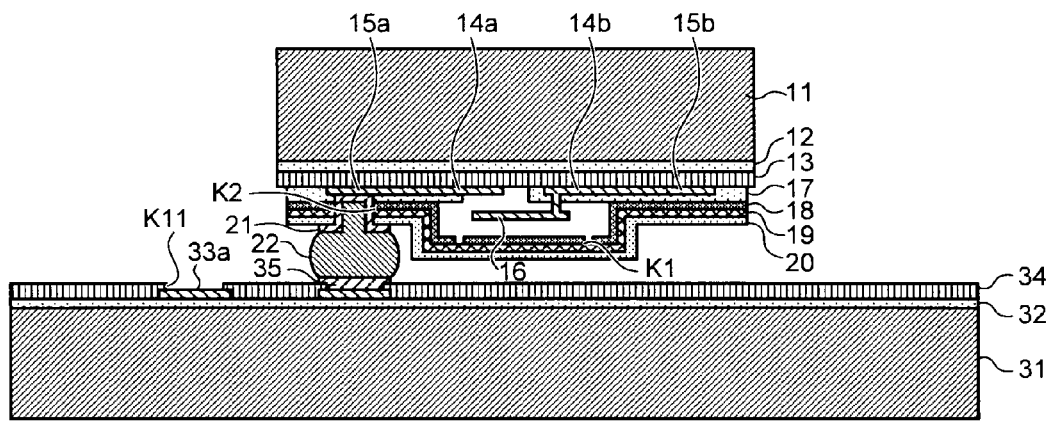

As shown in FIG. 3A, the protruding electrode 22 shown in FIG. 1 and the protruding electrode 36 shown in FIG. 2B are joined, whereby the MEMS chip shown in FIG. 1 is mounted face-down on the semiconductor wafer 31 shown in FIG. 3 such that the movable section 16 is opposed to the semiconductor wafer 31. The electrode 15a of the MEMS chip and the pad electrode 33b of the semiconductor wafer 31 are connected.

When the MEMS chip is mounted face-down on the semiconductor wafer 31 via the protruding electrodes 22 and 36, metal junction such as solder junction or alloy junction can be used. Welding junction such as anisotropic conductive film (ACF) junction, nonconductive film (NCF) junction, anisotropic conductive paste (ACP) junction, or nonconductive paste (NCP) junction can be used.

The MEMS chip and the semiconductor wafer 31 can be manufactured from separate wafers. After sorting out the wafers with a wafer level test, the MEMS chip can be mounted face-down on the semiconductor wafer 31. Therefore, manufacturing yield can be improved.

Figure 3B:
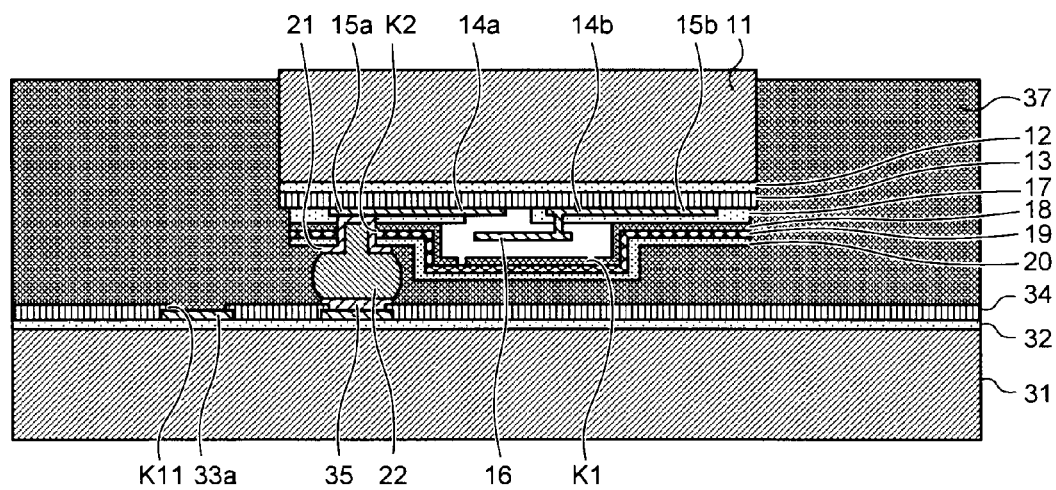

As shown in FIG. 3B, by using a method such as potting or molding, a resin layer 37 is formed on the semiconductor wafer 31 around the MEMS chip and filled in a gap between the MEMS chip and the semiconductor wafer 31 to reduce a step between the MEMS chip and the semiconductor wafer 31. The step between the MEMS chip and the semiconductor wafer 31 may be eliminated. As the material of the resin layer 37, for example, epoxy resin, silicon resin, or polyimide resin can be used. The thickness of the resin layer 37 on the semiconductor wafer 31 is desirably set such that the front surface of the resin layer 37 is located above the insulating film 13. In the method shown in FIG. 3B, the resin layer 37 is formed on the semiconductor wafer 31 around the MEMS chip and filled in the gap between the MEMS chip and the semiconductor wafer 31. However, the resin layer 37 can be formed on the semiconductor wafer 31 around the MEMS chip without being filled in the gap between the MEMS chip and the semiconductor wafer 31.

Figure 4A:
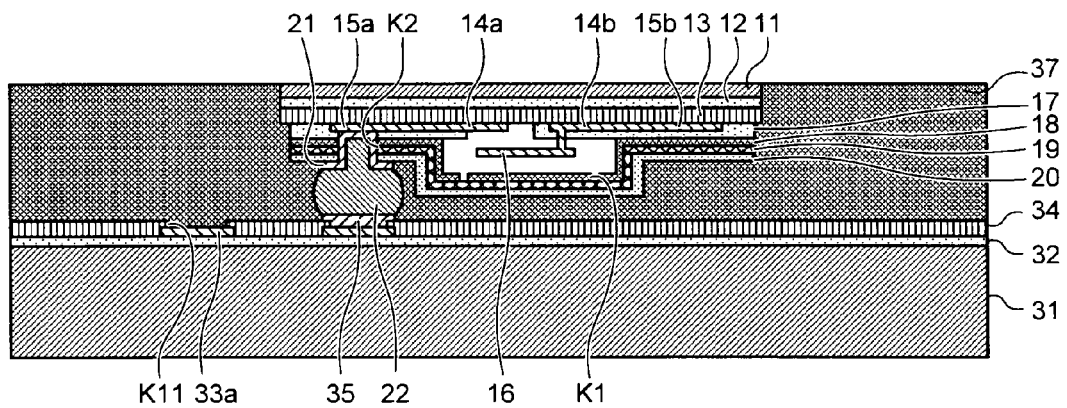

As shown in FIG. 4A, the resin layer 37 and the semiconductor substrate 11 are thinned by grinding the front surface of the resin layer 37 and the rear surface of the semiconductor substrate 11. As a method of thinning the resin layer 37 and the semiconductor substrate 11, for example, mechanical cutting or sandblast can be used.

Figure 4B:
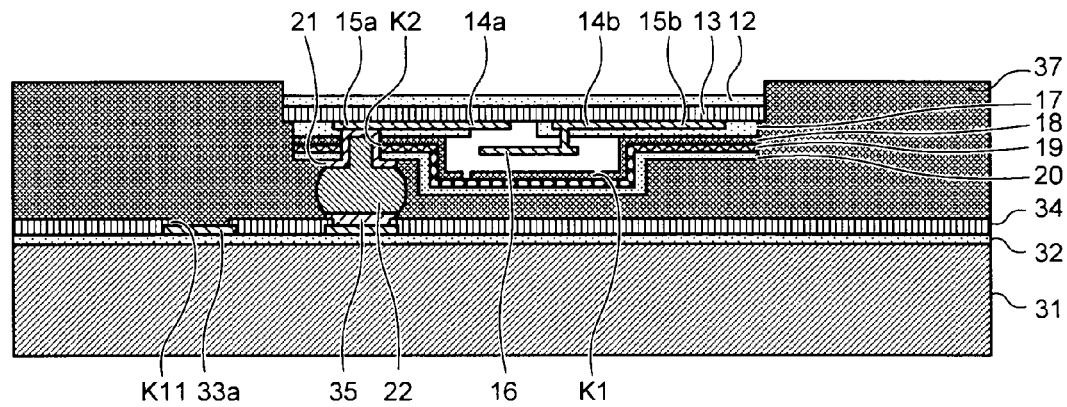

As shown in FIG. 4B, the semiconductor substrate 11 is removed from the insulating film 12 by wet-etching the semiconductor substrate 11. Therefore, the insulating film 12 can be prevented from being damaged. A selection ratio of the insulating film 12 and the semiconductor substrate 11 can be set large. The thickness of the insulating film 12 can be highly accurately managed.

Figure 5A:
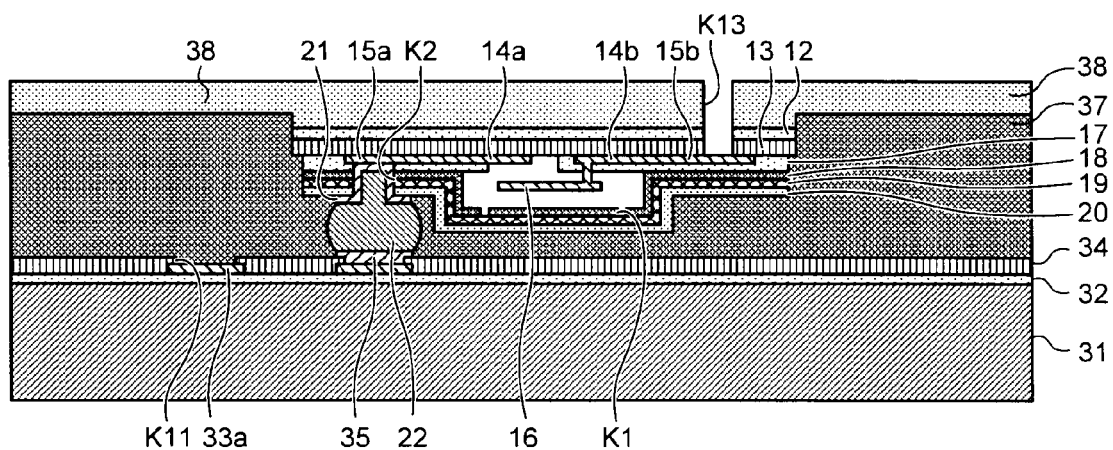

As shown in FIG. 5A, a resin layer 38 is formed on the resin layer 37 and the insulating film 12 by using a method such as potting or molding. As the material of the resin layer 38, for example, epoxy resin, silicon resin, or polyimide resin can be used. An opening K13 for exposing the rear surface of the electrode 15b is formed in the resin layer 38 and the insulating films 12 and 13 by using the photolithography technology and the dry etching technology.

Because the semiconductor substrate 11 is removed, in the formation of the resin layer 38 and the insulating films 12 and 13, the opening K13 can be aligned through the resin layer 38 and the insulating films 12 and 13. Therefore, it is unnecessary to use an expensive apparatus such as a double-side exposure machine to perform alignment for forming the opening K13. A reduction in cost for manufacturing the MEMS package can be realized.

Further, because the semiconductor substrate 11 is removed, when a wire is connected to the rear surface of the electrode 15b, it is unnecessary to form an opening having a high aspect ratio in the semiconductor substrate 11 and form an insulating film on the sidewall of the opening. Therefore, a manufacturing process can be simplified.

Figure 5B:
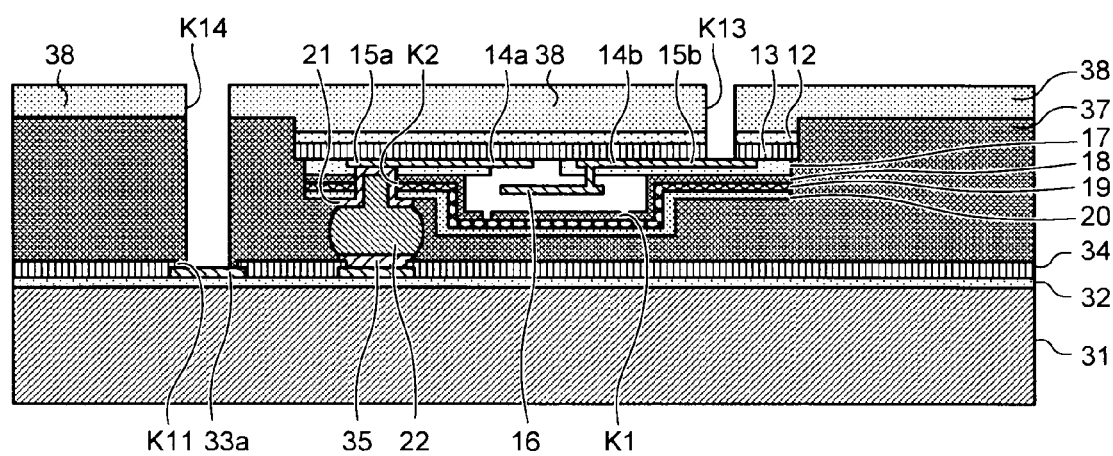

As shown in FIG. 5B, an opening K14 for exposing the front surface of the pad electrode 33a is formed in the resin layers 37 and 38 by using, for example, laser machining. Photosensitive resin can be used as the resin layers 37 and 38. In this case, the opening K14 can be formed by exposure and development of the photosensitive resin.

A seed layer is formed on the front surface of the pad electrode 33a, the rear surface of the electrode 15b, the sidewalls of the openings K13 and K14, and the front surface of the resin layer 38 by using a method such as vapor deposition or sputtering. A resist pattern for selective plating is formed on the seed layer. Electrolytic plating is applied on the seed layer with the resist pattern for selective plating as a mask. A wire 39a connected to the front surface of the pad electrode 33a and a land electrode 40a connected to the wire 39a are formed on the resin layer 38. A wire 39b connected to the rear surface of the electrode 15b and a land electrode 40b connected to the wire 39b are formed on the resin layer 38. After the resist pattern for selective plating is removed, the wires 39a and 39b are electrically separated by removing the seed layer under the resist pattern.

Figure 6A:
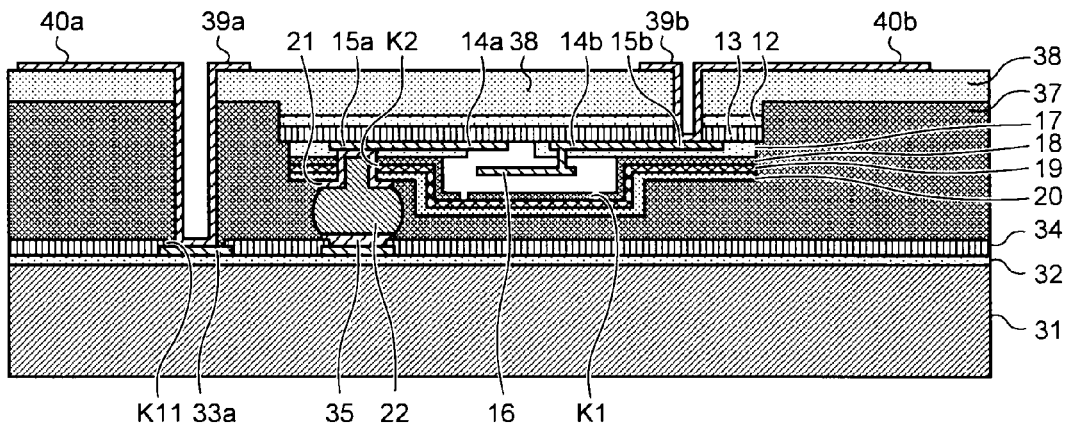
Figure 6B:
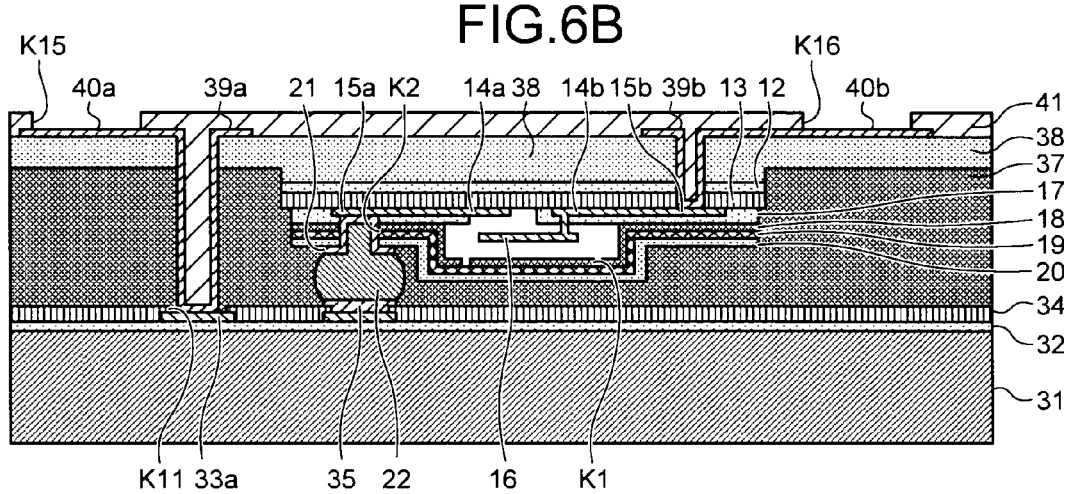

As shown in FIG. 6B, a solder resist 41 is formed on the wires 39a and 39b and the land electrodes 40a and 40b. Openings K15 and K16 for respectively exposing the front surfaces of the land electrodes 40a and 40b are formed in the solder resist 41.

Figure 7:
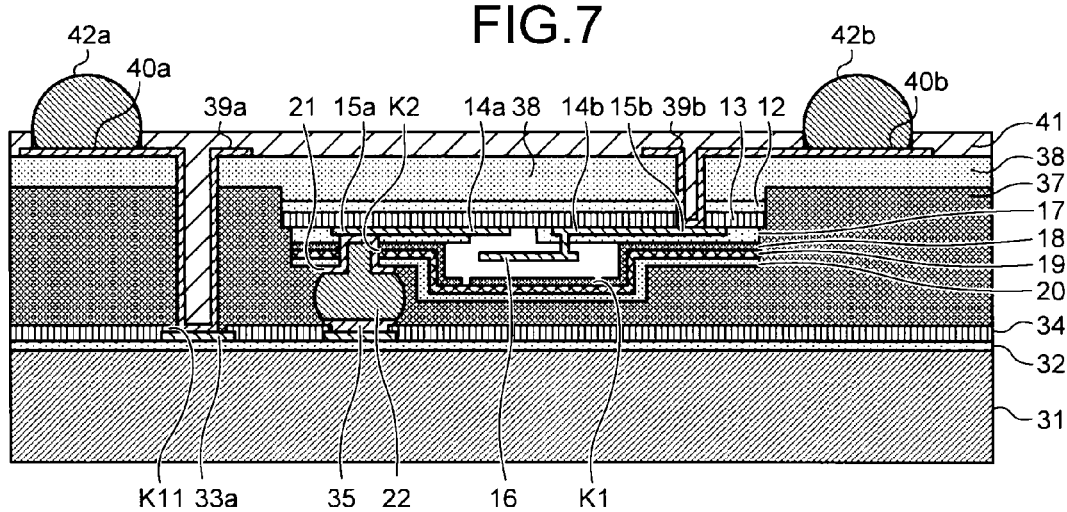

As shown in FIG. 7, protruding electrodes 42a and 42b respectively joined to the land electrodes 40a and 40b are respectively formed on the land electrodes 40a and 40b. By dicing the semiconductor wafer 31 on which the protruding electrodes 42a and 42b are formed, the semiconductor wafer 31 is individuated for each semiconductor chip. As the protruding electrodes 42a and 42b, for example, a solder ball, an Au bump, or a Cu bump or a Ni bump coated with a solder material or the like can be used. As a method of forming the protruding electrodes 42a and 42b, electrolytic plating, solder printing, or a method of mounting a solder ball can be used.

The semiconductor substrate 11 on the MEMS chip is removed after the MEMS chip is mounted face-down on the semiconductor wafer 31. This makes it possible to reduce stray capacitance between the wires 14a and 14b and electrodes 15a and 15b and the semiconductor substrate 11 while enabling handling of the MEMS chip. Therefore, a loss of signals transmitted by the wires 14a and 14b can be reduced.

The rear surface of the electrode 15b of the MEMS chip is connected to the land electrode 40b. This makes it possible to directly connect a wire from the MEMS chip to the outside of the MEMS package even when the MEMS chip is mounted face-down on the semiconductor wafer 31. Therefore, to connect the wire from the MEMS chip to the outside of the MEMS package, it is unnecessary to connect the wire through the semiconductor wafer 31. It is possible to prevent parasitic capacitance from being formed between the MEMS chip and the semiconductor wafer 31 and prevent noise from being caused between the MEMS chip and the semiconductor wafer 31. Therefore, handling of a high-speed signal and an analog signal can be simplified.

The resin layers 37 and 38 are formed on the semiconductor wafer 31 around the MEMS chip. This makes it possible to form the protruding electrodes 42a and 42b, which are respectively connected to the pad electrode 33a and the electrode 15b, on the semiconductor wafer 31 even when the MEMS chip is mounted face-down on the semiconductor wafer 31. Therefore, an IC chip on which the MEMS chip is mounted face-down can be flip-chip mounted on the mother board. It is unnecessary to use wire bonding to connect a wire from the IC chip to the outside of the package. Therefore, it is possible to prevent parasitic inductance from increasing and preventing characteristic impedance from being unable to be matched. Handling of a high-speed signal and an analog signal can be further simplified and a reduction in size of the MEMS package can be realized.

The rear surface of the semiconductor wafer 31 can be thinned by mechanical grinding or the like to further reduce the thickness of the MEMS package. The mechanical grinding is desirably performed, for example, before or after the step shown in FIG. 2B, before or after the step shown in FIG. 4A, or before or after the step shown in FIG. 7.

In the MEMS package shown in FIG. 7, the electrode pads 33a and 33b are formed on the semiconductor wafer 31. The movable section 16 is formed above the insulating film 13. The electrodes 15a and 15b that are electrically connected to the movable section 16 and can supply a driving signal to the movable section 16 when necessary are formed on the insulating film 13. The movable section 16 is arranged to be opposed to the semiconductor wafer 31. The electrode 15a and the pad electrode 33b are connected via the protruding electrode 22. The entire movable section 16 is embedded in the resin layers 37 and 38. The land electrodes 40a and 40b are formed on the resin layer 38. The land electrode 40b is connected to the rear surface of the electrode 15b via the opening K13 for exposing the rear surface of the electrode 15b. The land electrode 40a is connected to the front surface of the pad electrode 33a via the opening K14 pierced through the resin layers 37 and 38.

As a modification of the MEMS package shown in FIG. 7, the insulating films 12 and 13 can be extended to the pad electrode 33a, an isolated electrode, which is opposed to the pad electrode 33a, can be formed on the insulating film 13 separately from the electrodes 15a and 15b, and the isolated electrode and the pad electrode 33a can be connected by a protruding electrode. An opening for exposing the rear surface of the isolated electrode can be formed in the insulating films 12 and 13 and the isolated electrode can be connected to the land electrode 40a via the opening.

The isolated electrode opposed to the pad electrode 33a is formed on the insulating film 13. The isolated electrode and the pad electrode 33a are connected by the protruding electrode. This makes it possible to connect the pad electrode 33a and the land electrode 40a without providing the opening K14 pierced through the resin layers 37 and 38. The step of forming a through-hole in the resin layers 37 and 38 can be eliminated.

FIGS. 8A and 8B and FIGS. 9A and 9B are sectional views of a method of manufacturing an MEMS package according to a second embodiment of the present invention.

Figure 8A:
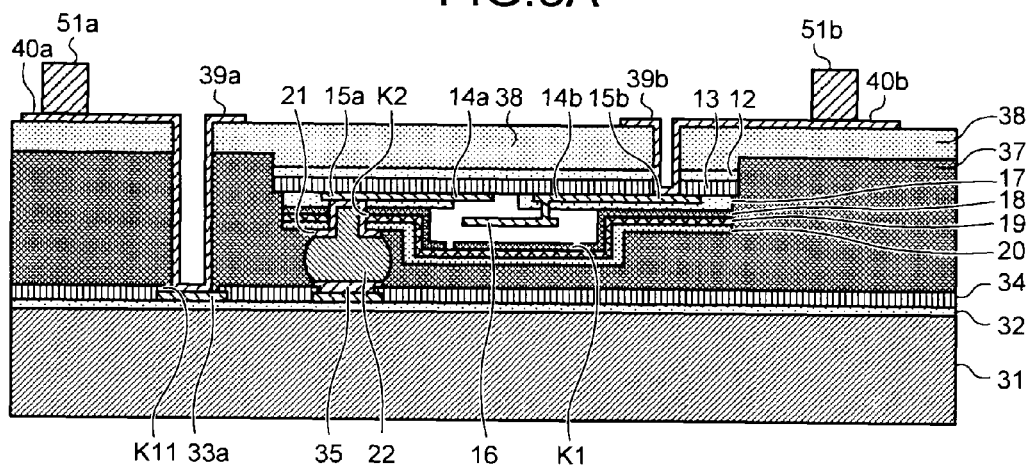
FIGS. 8A, 8B, 9A and 9B are sectional views of the method of manufacturing an MEMS package according to the second embodiment.

In FIG. 8A, after the steps shown in FIGS. 1 to 6A are performed, metal pillars 51a and 51b are respectively formed on the land electrodes 40a and 40b. As the material of the metal pillars 51a and 51b, for example, Cu or Ni can be used.

Figure 8B:
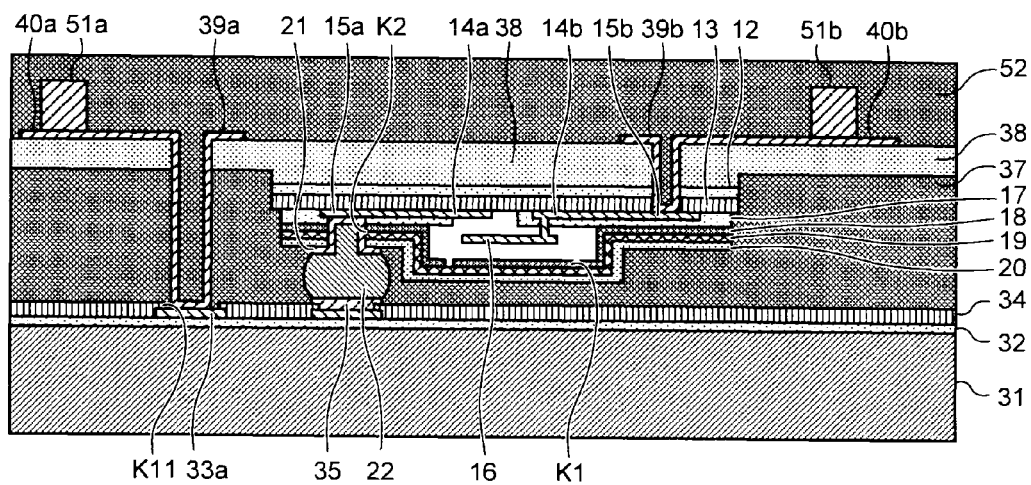

As shown in FIG. 8B, a resin layer 52 is formed on the resin layer 38 to cover the metal pillars 51a and 51b by using a method such as potting or molding. As the material of the resin layer 52, for example, epoxy resin, silicon resin, or polyimide can be used.

Figure 9A:
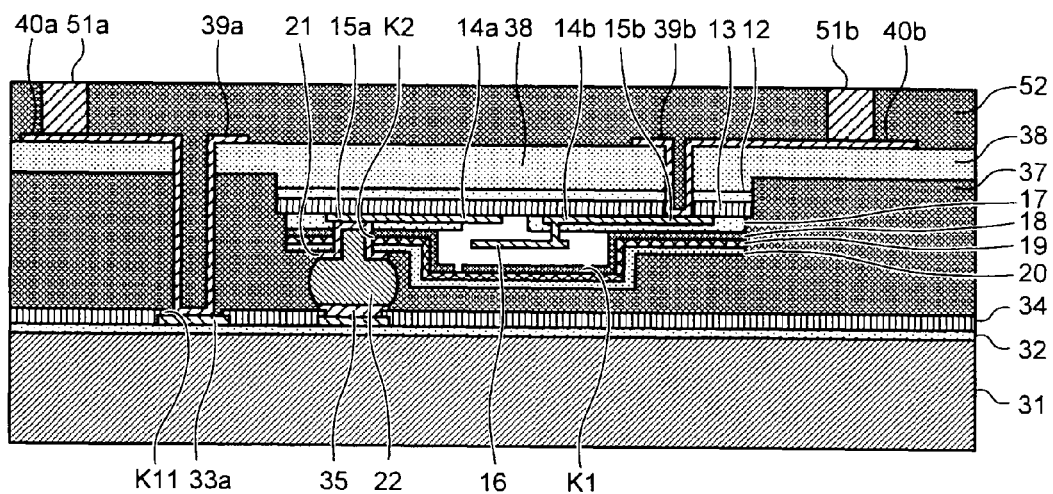

As shown in FIG. 9A, the resin layer 52 is thinned to expose the front surfaces of the metal pillars 51a and 51b by grinding the front surface of the resin layer 52. As a method of thinning the resin layer 52, for example, mechanical cutting or sandblast can be used.

Figure 9B:
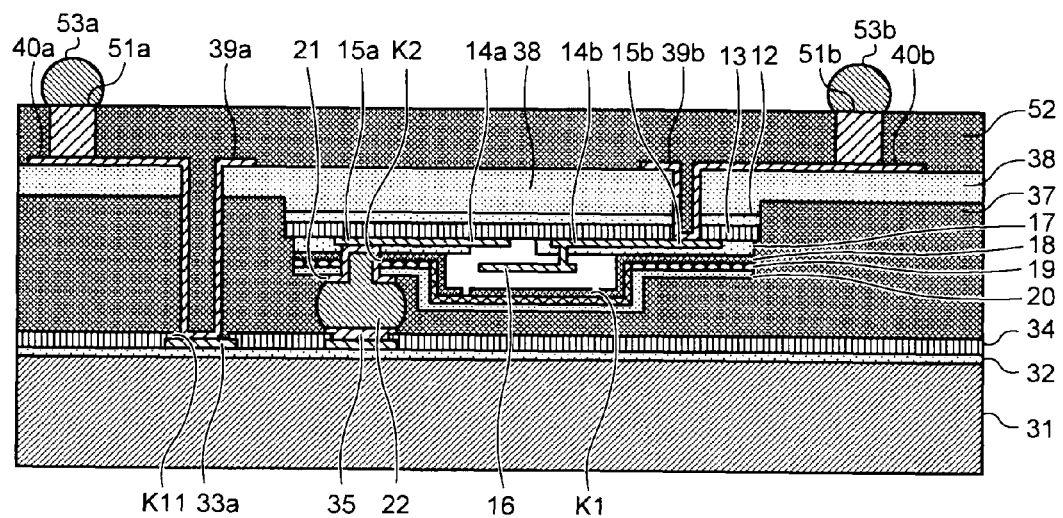

As shown in FIG. 9B, protruding electrodes 53a and 53b respectively joined to the metal pillars 51a and 51b are respectively formed on the metal pillars 51a and 51b. The semiconductor wafer 31 is individuated for each semiconductor chip by dicing the semiconductor wafer 31 on which the protruding electrodes 53a and 53b are formed.

This makes it possible to configure, as a chip-size package, the MEMS package in which the MEMS chip is mounted face-down on the IC chip and protect the wires 39a and 39b and the land electrodes 40a and 40b with the resin layer 52. Therefore, reliability of the MEMS package can be improved.

Figure 10:
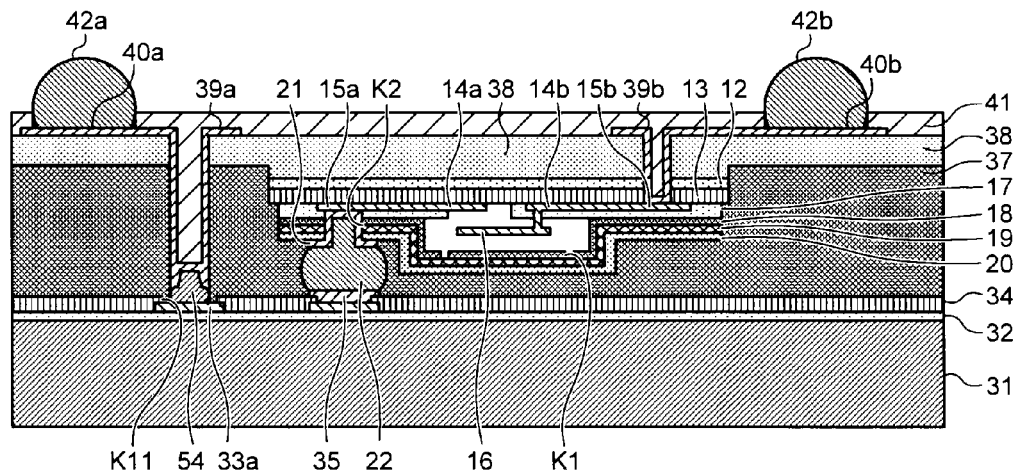
FIG. 10 is a sectional view of the method of manufacturing an MEMS package according to the third embodiment.

FIG. 10 is a sectional view of a method of manufacturing an MEMS package according to a third embodiment of the present invention.

In FIG. 10, in addition to the components shown in FIG. 7, a stud bump 54 is formed on the pad electrode 33a. As the material of the stud bump 54, for example, Au, Cu, or Ni can be used. The stud bump 54 can be formed before or after the step shown in FIG. 2A.

After the stud bump 54 is formed on the pad electrode 33a before or after the step shown in FIG. 2A, the MEMS package shown in FIG. 10 can be manufactured by performing the steps shown in FIGS. 2B to 7.

Because the stud bump 54 is formed on the pad electrode 33a, the stud bump 54 can be used as a stopper for laser machining when the opening K14 is formed in the resin layers 37 and 38 in the step shown in FIG. 5B. Therefore, a margin of the laser machining can be increased and the depth of the laser machining can be reduced. It is possible to reduce machining time while improving machining accuracy.

FIGS. 11A and 11B to FIG. 15 are sectional views of a method of manufacturing an MEMS package according to a fourth embodiment of the present invention.

Figure 11A:
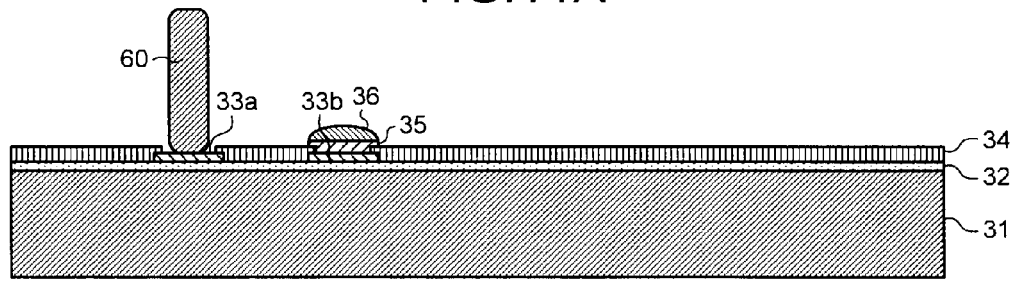
FIGS. 11A, 11B, 12A, 12B, 13A, 13B, 14A, 14B and 15 are sectional views of the method of manufacturing an MEMS package according to the fourth embodiment.

In FIG. 11A, a conductor bump 60 is formed on the pad electrode 33b. The formation of the conductor bump 60 can be performed before or after the step shown in FIG. 3. The conductor bump 60 can be formed by, for example, laminating the stud bump 54 shown in FIG. 10 in multiple stages. The height of the conductor bmp 60 can be set such that the tip of the conductor bmp 60 is located above the position of the insulating layer 12 when the MEMS chip shown in FIG. 1 is mounted face-down on the semiconductor wafer 31. For example, the stud bump 54 shown in FIG. 10 can be laminated in three stages to be set to the height of about 90 micrometers.

Figure 11B:
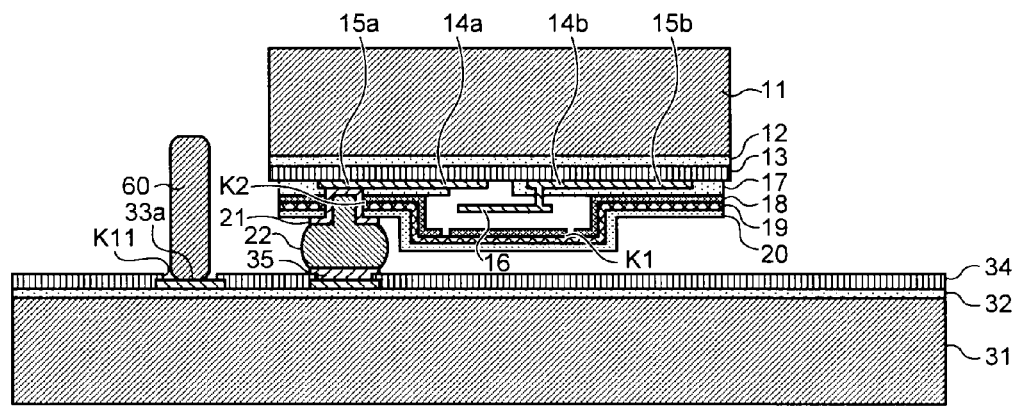

As shown in FIG. 11B, the protruding electrode 22 shown in FIG. 1 and the protruding electrode 36 shown in FIG. 11A are joined to avoid the conductor bump 60. The MEMS chip shown in FIG. 1 is mounted face-down on the semiconductor wafer 31 shown in FIG. 11A such that the movable section 16 is opposed to the semiconductor wafer 31. The electrode 15a of the MEMS chip and the pad electrode 33b of the semiconductor wafer 31 are connected.

Figure 12A:
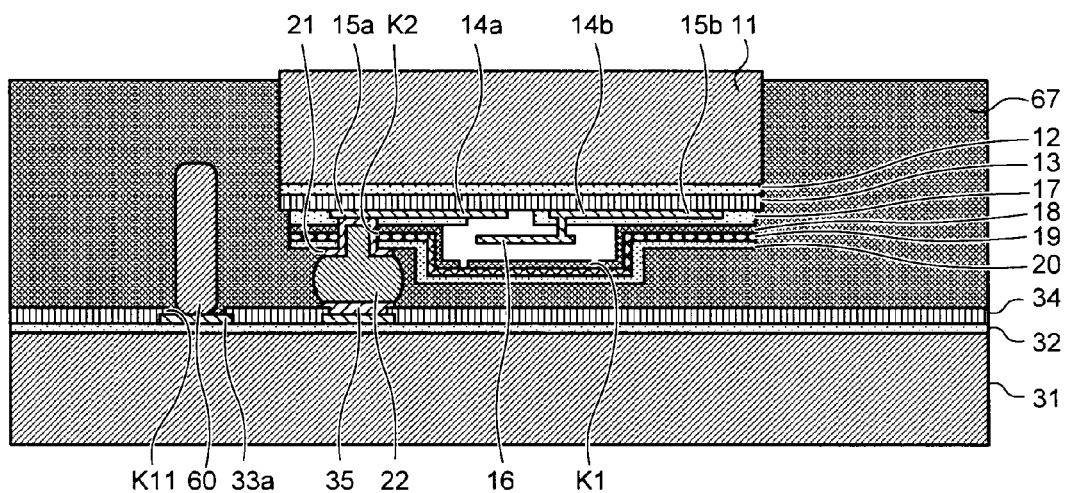

As shown in FIG. 12A, a resin layer 67 is formed on the semiconductor wafer 31 around the MEMS chip and filled in a gap between the MEMS chip and the semiconductor wafer 31 by using a method such as potting or molding to reduce a step between the MEMS chip and the semiconductor wafer 31 while covering the conductor bump 60.

Figure 12B:
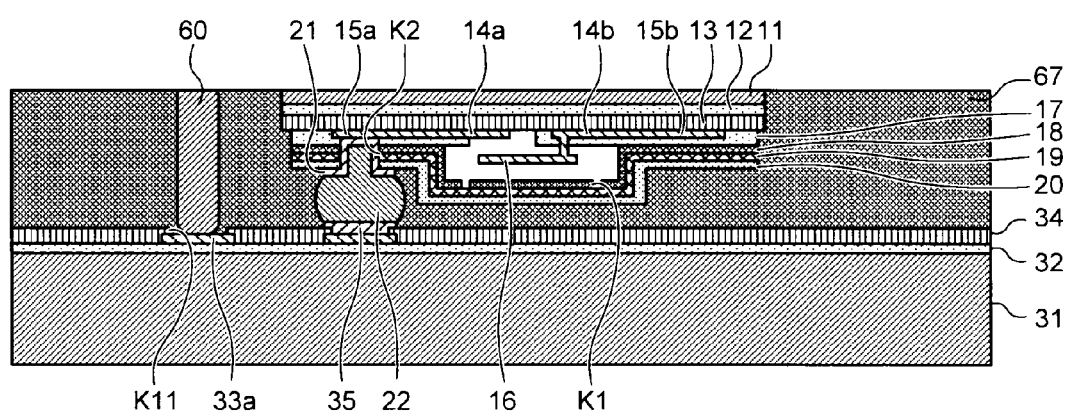

As shown in FIG. 12B, the resin layer 67 and the semiconductor substrate 11 are thinned and the front surface of the conductor bump 60 is exposed by grinding the front surface of the resin layer 67 and the rear surface of the semiconductor substrate 11.

Figure 13A:
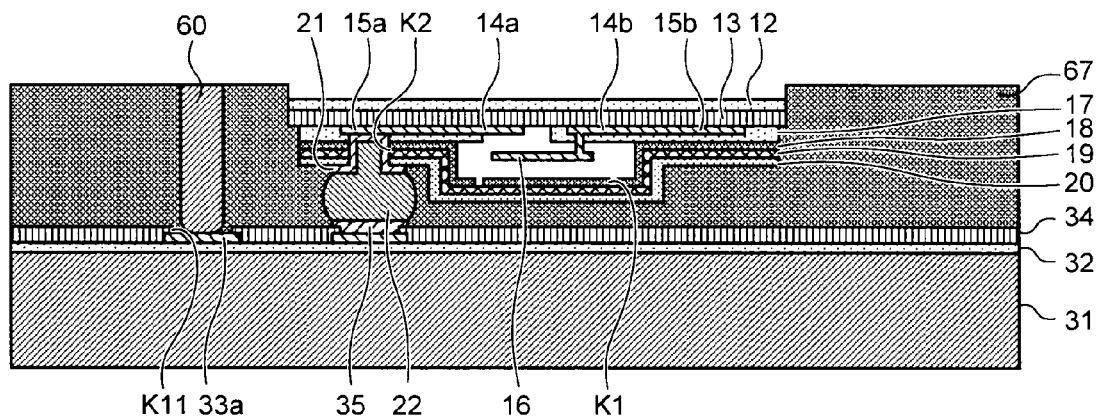

As shown in FIG. 13A, the semiconductor substrate 11 is removed from the insulating film 12 by wet-etching the semiconductor substrate 11.

Figure 13B:
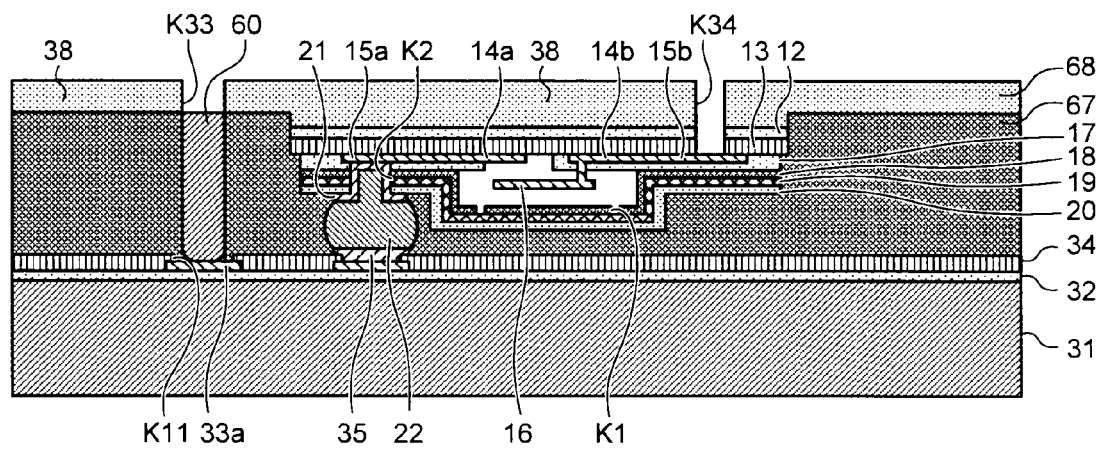

As shown in FIG. 13B, a resin layer 68 is formed on the resin layer 67 and the insulating film 12 by using a method such potting or molding.

An opening K33 for exposing the front surface of the conductor bump 60 is formed in the resin layer 68 and an opening K34 for exposing the rear surface of the electrode 15b is formed in the resin layer 68 and the insulating films 12 and 13 by using the photolithography technology and the dry etching technology.

Figure 14A:
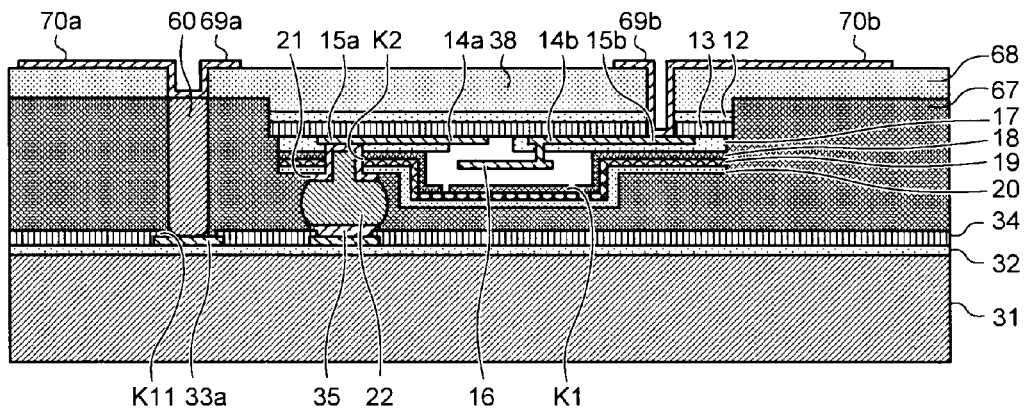

As shown in FIG. 14A, a seed layer is formed on the front surface of the conductor bump 60, the rear surface of the electrode 15b, the sidewalls of the openings K33 and K34, and the front surface of the resin layer 68 by using a method such as vapor deposition or sputtering. A resist pattern for selective plating is formed on the resin layer 68. Electrolytic plating is applied on the seed layer with the resist pattern for selective plating as a mask. A wire 69a connected to the front surface of the conductor bump 60 and a land electrode 70a connected to the wire 69a are formed on the resin layer 68. A wire 69b connected to the rear surface of the electrode 15b and a land electrode 70b connected to the wire 69b are formed on the resin layer 68. After the resist pattern for selective plating is removed, the wires 69a and 69b are electrically separated by removing the seed layer under the resist pattern.

Figure 14B:
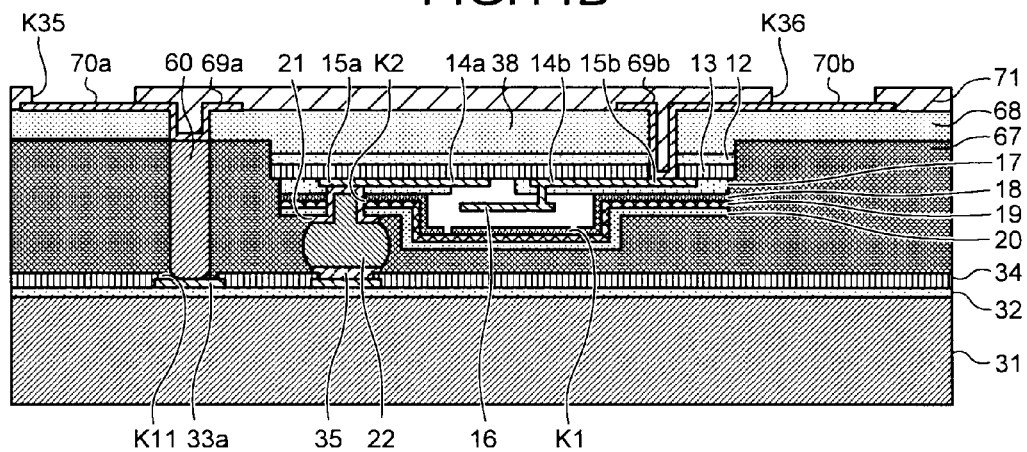

As shown in FIG. 14B, a solder resist 71 is formed on the wires 69a and 69b and the land electrodes 70a and 70b. Openings K35 and K36 for respectively exposing the front surfaces of the land electrodes 70a and 70b are formed in the solder resist 71.

Figure 15:
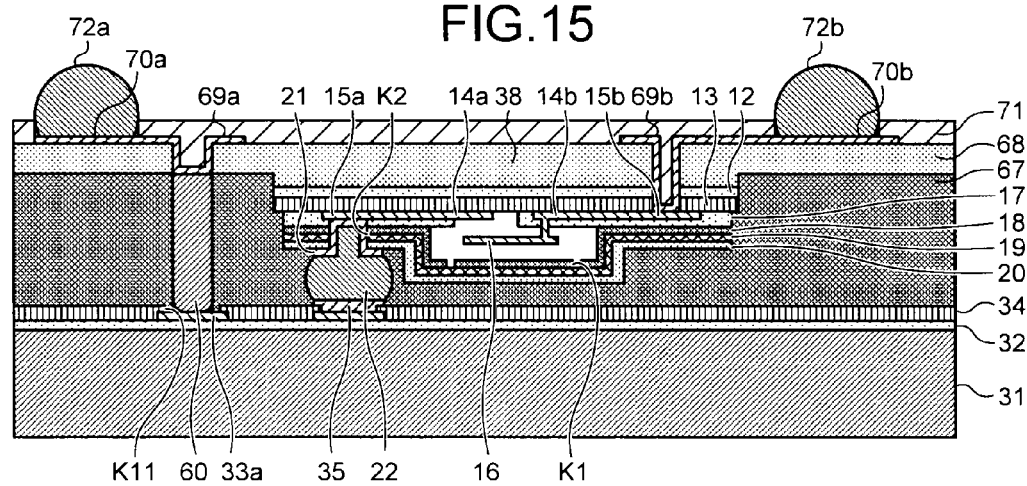

As shown in FIG. 15, protruding electrodes 72a and 72b respectively joined to the land electrodes 70a and 70b are respectively formed on the land electrodes 70a and 70b. The semiconductor wafer 31 is individuated for each semiconductor chip by dicing the semiconductor wafer 31 on which the protruding electrodes 72a and 72b are formed.

The resin layer 67 is formed on the semiconductor wafer 31 after the conductor bump 60 is formed on the pad electrode 33b. This makes it possible to electrically connect the pad electrode 33b and the protruding electrode 72a without forming an opening for exposing the pad electrode 33b in the resin layer 67. Therefore, laser machining can be omitted.

FIGS. 16A and 16B to FIG. 21 are sectional views of a method of manufacturing an MEMS package according to a fifth embodiment of the present invention.

Figure 16A:
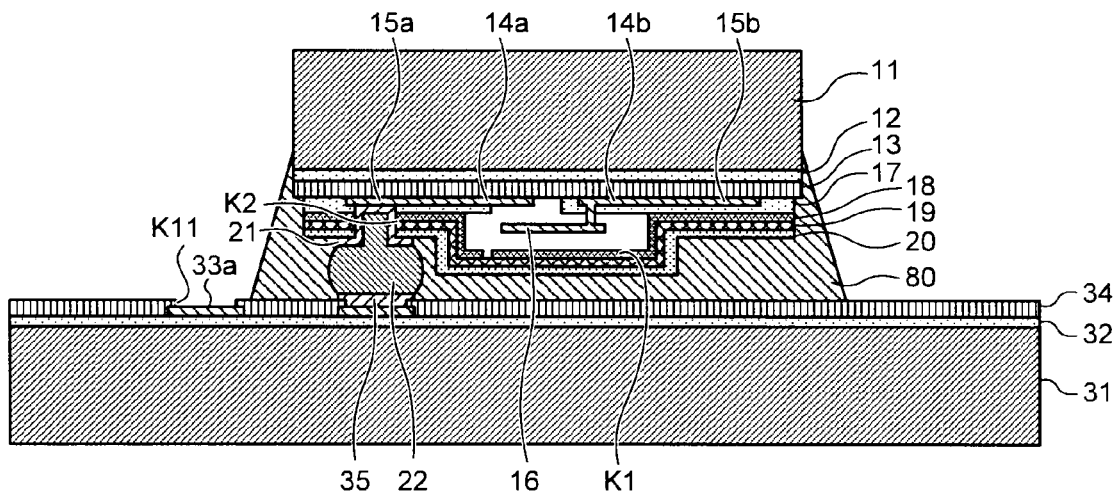
FIGS. 16A, 16B, 17A, 17B, 18A, 18B, 19A, 19B, 20A, 20B and 21 are sectional views of the method of manufacturing an MEMS package according to the fifth embodiment.

In FIG. 16A, after the step shown in FIG. 3A, a resin layer 80 is filled in a gap between the MEMS chip and the semiconductor wafer 31 by using a method such as potting. As the material of the resin layer 80, for example, epoxy resin or silicon resin can be used.

Figure 16B:
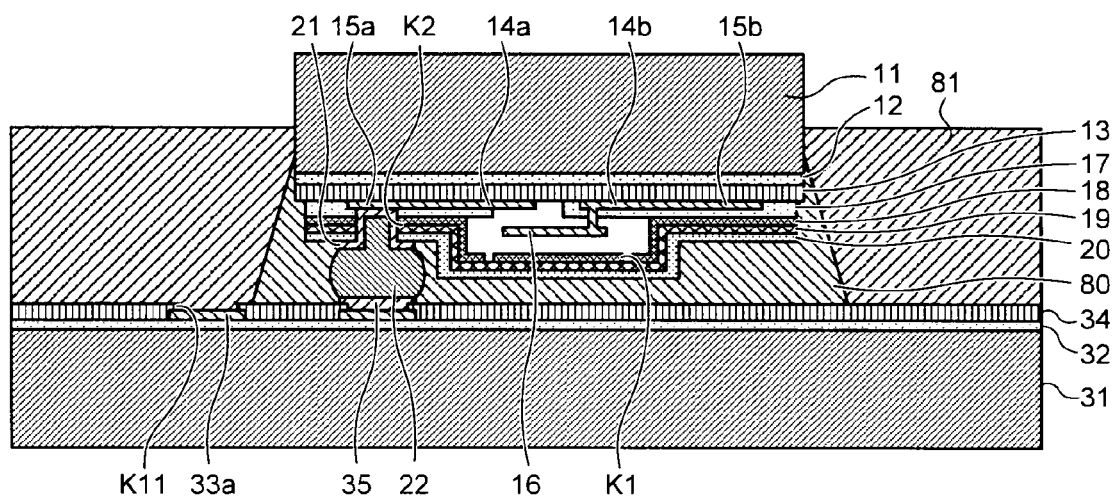

As shown in FIG. 16B, a resin layer 81 is formed on the semiconductor wafer 31 around the MEMS chip by using a method such as potting. As the material of the resin layer 81, for example, resist can be used. The thickness of the resin layer 81 is desirably set such that the front surface of the resin layer 81 is located above the insulating film 12 and located below the rear surface of the semiconductor substrate 11.

Figure 17A:
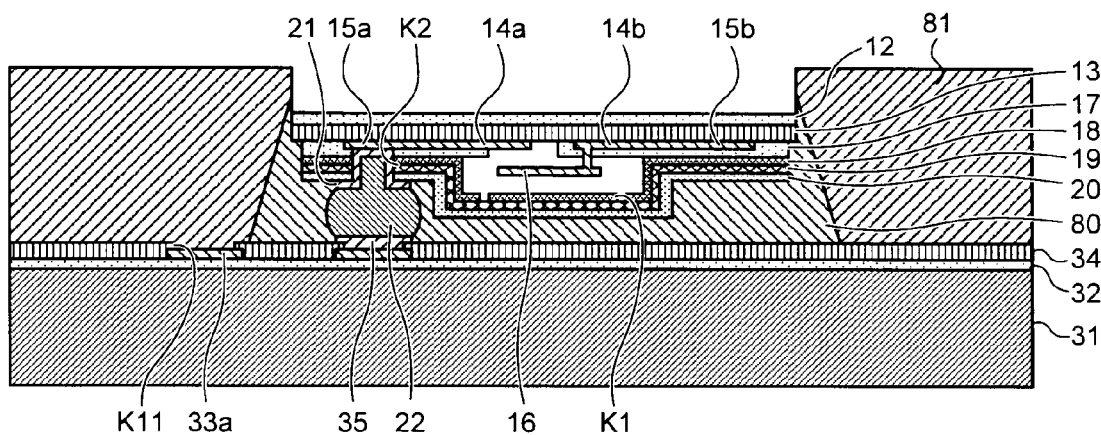

As shown in FIG. 17A, the semiconductor substrate 11 is removed from the insulating film 12 by wet-etching the semiconductor substrate 11.

Figure 17B:
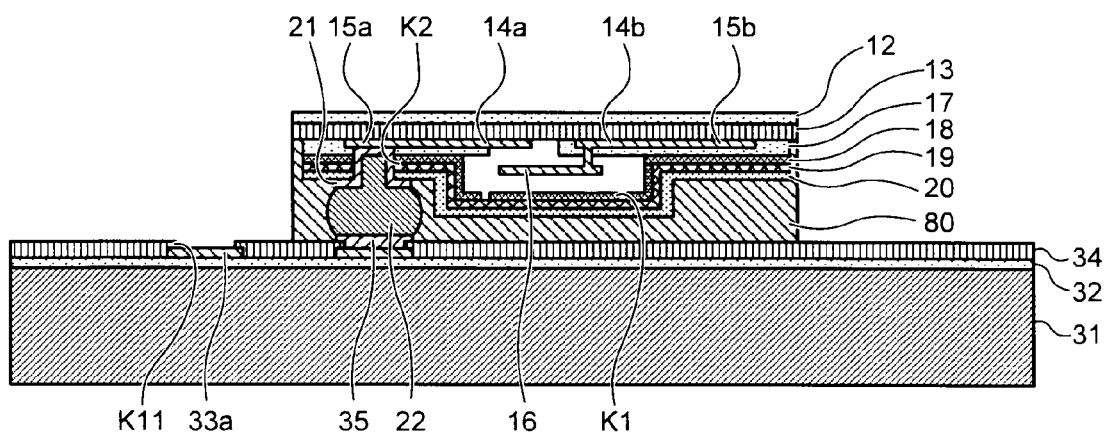

As shown in FIG. 17B, the resin layers 80 and 81 around the MEMS chip are moved from the semiconductor wafer 31 by performing anisotropic etching of the resin layers 80 and 81.

Figure 18A:
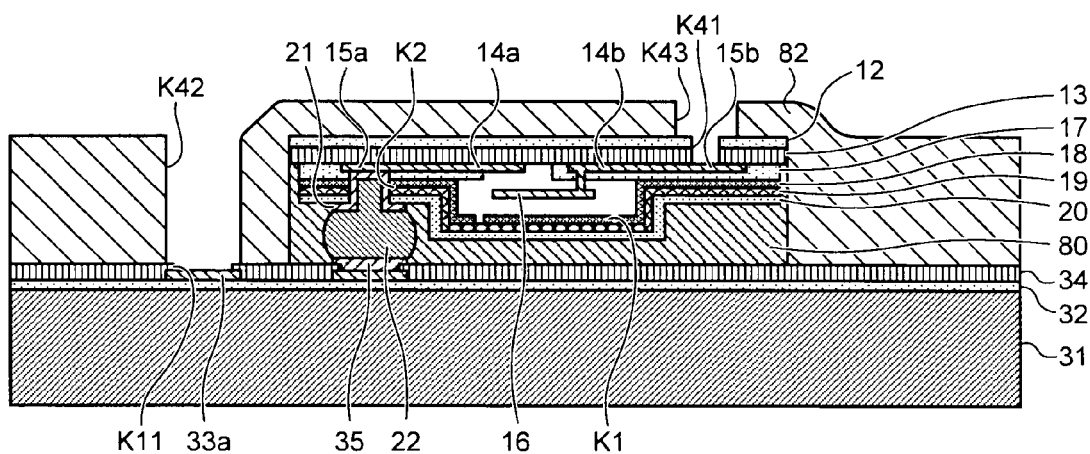

As shown in FIG. 18A, a photosensitive resin layer 82 is formed on the MEMS chip and on the semiconductor wafer 31 around the MEMS chip by using a method such as spin coat, potting, or molding to eliminate a step between the MEMS chip and the semiconductor wafer 31. As the material of the photosensitive resin layer 82, for example, photosensitive polyimide can be used. An opening K42 for exposing the front surface of the pad electrode 33a and an opening K43 for exposing the insulating film 12 on the rear surface of the electrode 15b are formed in the photosensitive resin layer 82 by selectively performing exposure and development of the photosensitive resin layer 82. An opening K41 for exposing the rear surface of the electrode 15b is formed in the insulating films 12 and 13 by using the photolithography technology and the dry etching technology.

Figure 18B:
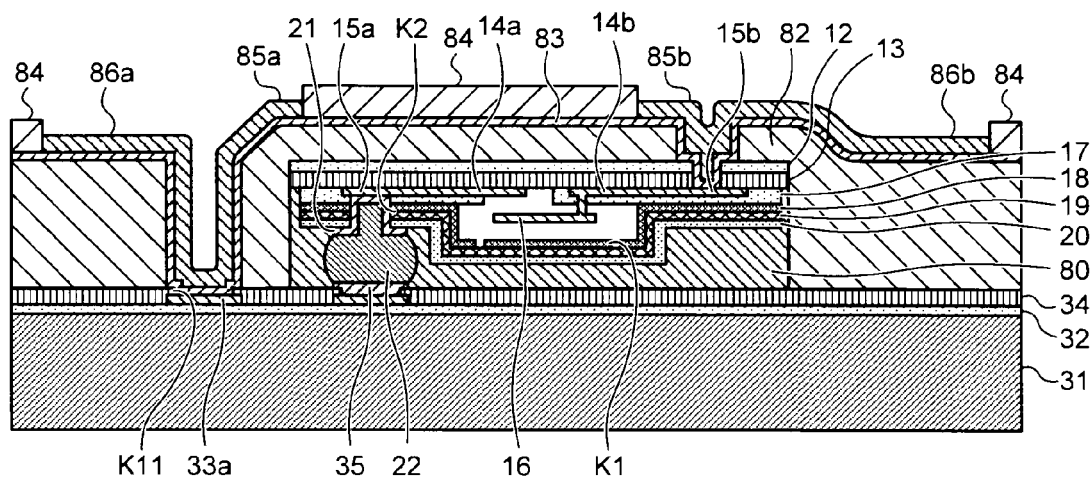

As shown in FIG. 18B, a seed layer 83 is formed on the front surface of the pad electrode 33a, the rear surface of the electrode 15b, the sidewalls of the openings K41 to K43, and the front surface of the photosensitive resin layer 82 by using a method such as vapor deposition or sputtering. A resist pattern 84 for selective plating is formed on the seed layer 83. Electrolytic plating is applied on the seed layer 83 with the resist pattern 84 for selective plating as a mask. A wire 85a connected to the front surface of the pad electrode 33a and a land electrode 86a connected to the wire 85a are formed on the photosensitive resin layer 82. A wire 85b connected to the rear surface of the electrode 15b and a land electrode 86b connected to the wire 85b are formed on the photosensitive resin layer 82.

Figure 19A:
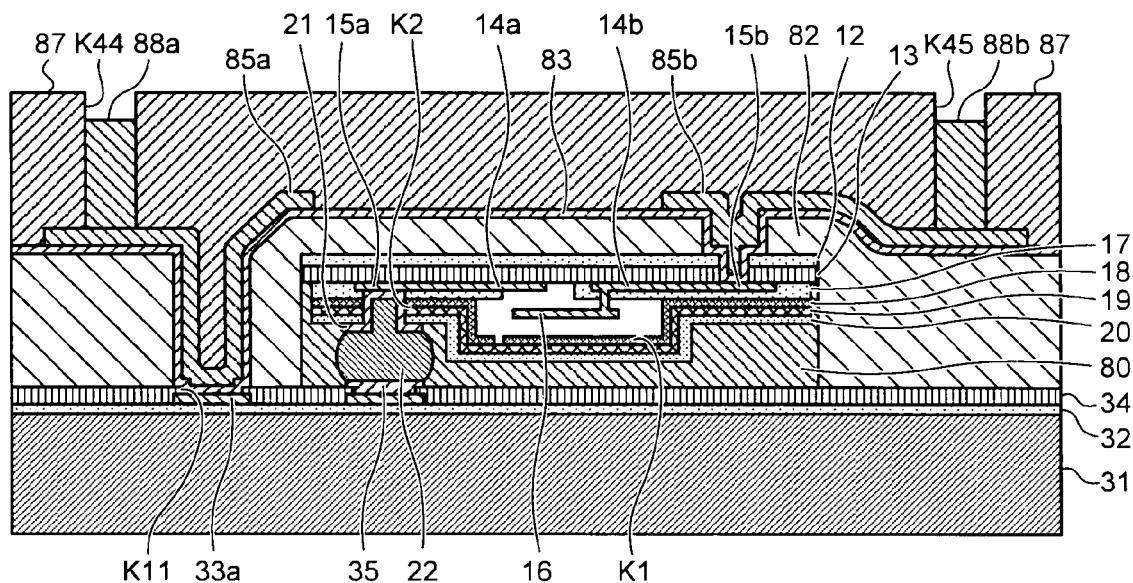

As shown in FIG. 19A, after the resist pattern 84 for selective plating is removed, a resist pattern 87 for selective plating is formed on the seed layer 83. Electrolytic plating is applied on the land electrodes 86a and 86b with the resist pattern 87 for selective plating as a mask. Metal pillars 88a and 88b are respectively formed on the land electrodes 86a and 86b.

Figure 19B:
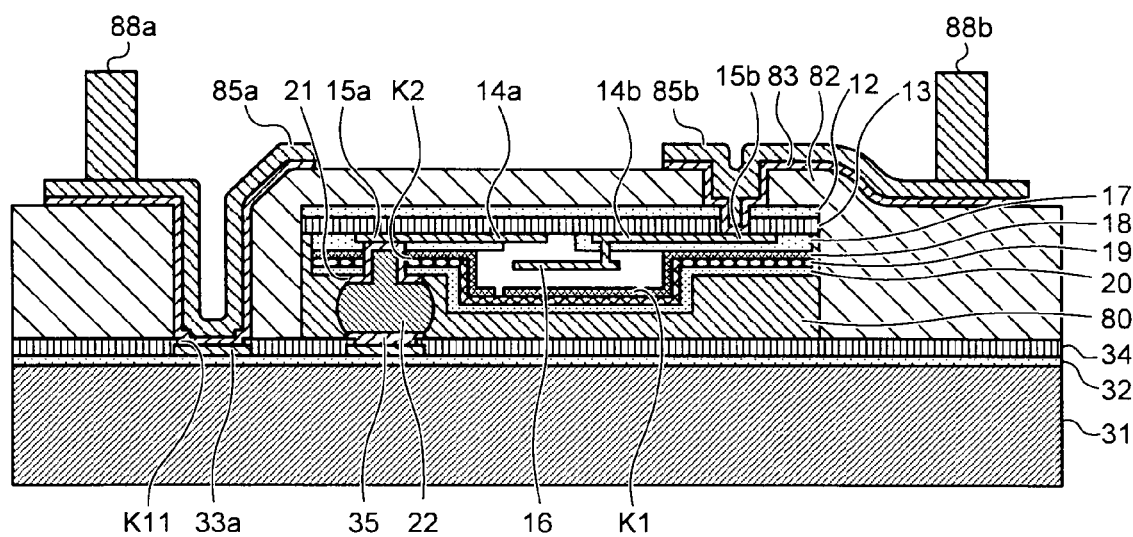

As shown in FIG. 19B, after the resist pattern 87 for selective plating is removed, the wires 85a and 85b are electrically separated by removing the seed layer 83 exposed from the wires 85a and 85b and the land electrodes 86a and 86b.

Figure 20A:
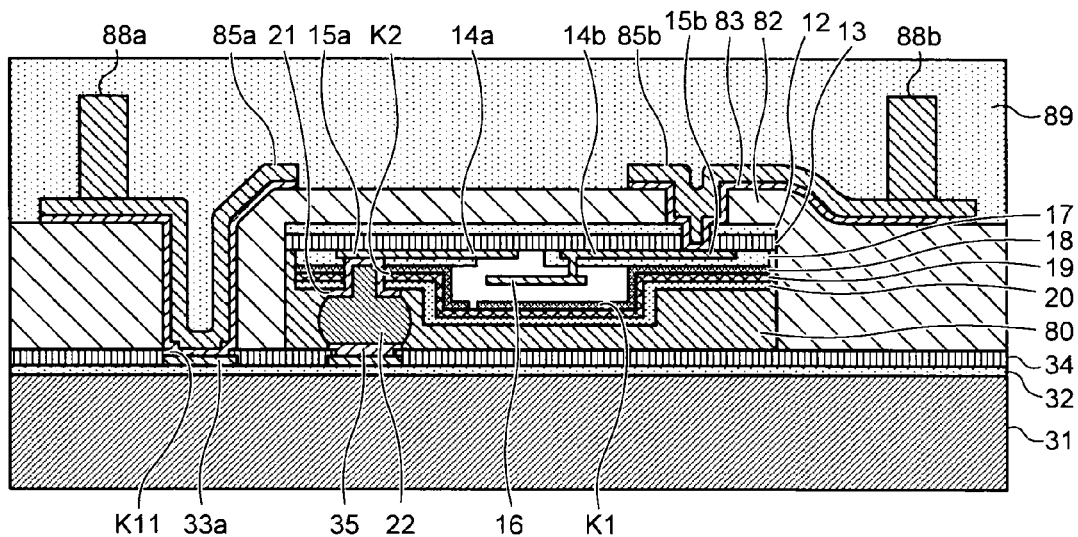

As shown in FIG. 20A, a resin layer 89 is formed on the photosensitive resin layer 82 to cover the metal pillars 88a and 88b by using a method such as potting or molding. As the material of the resin layer 89, for example, epoxy resin, silicon resin, or polyimide resin can be used.

Figure 20B:
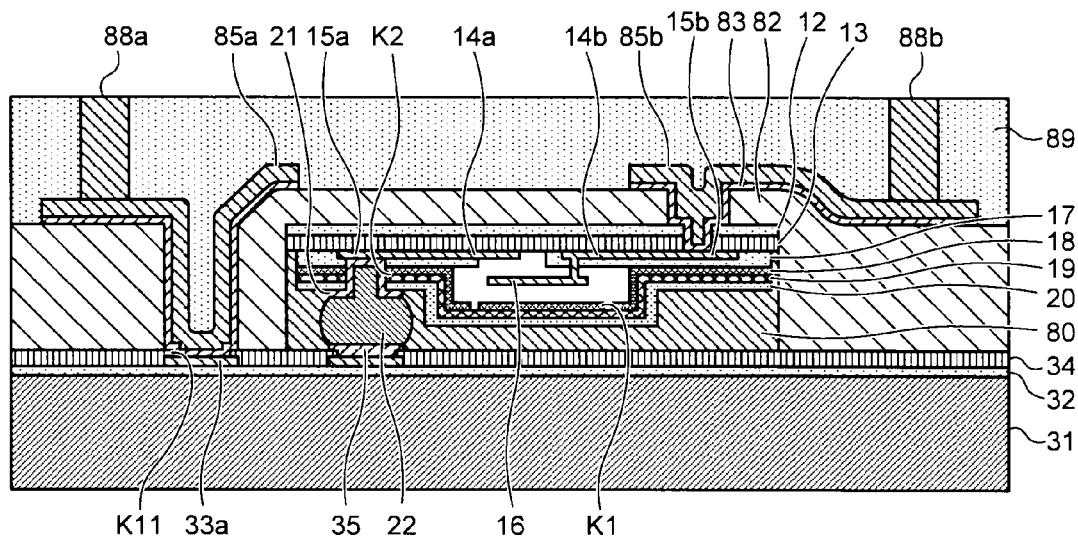

As shown in FIG. 20B, the resin layer 89 is thinned by grinding the front surface of the resin layer 89 to expose the front surfaces of the metal pillars 88a and 88b. As a method of thinning the resin layer 89, for example, mechanical cutting or sandblast can be used.

Figure 21:
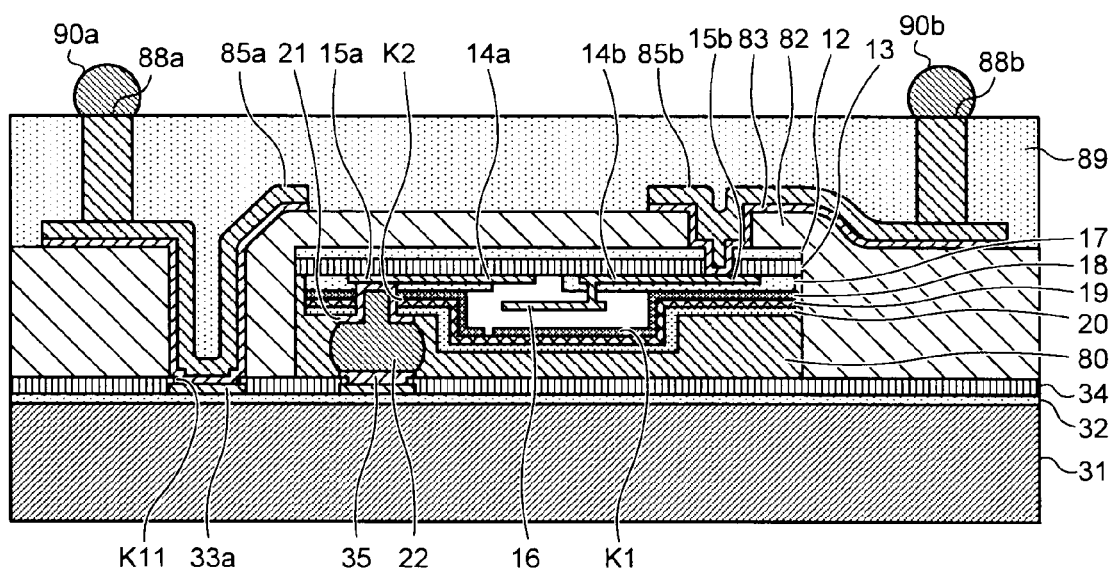

As shown in FIG. 21, protruding electrodes 90a and 90b respectively joined to the metal pillars 88a and 88b are respectively formed on the metal pillars 88a and 88b. The semiconductor wafer 31 is individuated for each semiconductor chip by dicing the semiconductor wafer 31 on which the protruding electrodes 90a and 90b are formed.

After the semiconductor substrate 11 is removed from the MEMS chip, the photosensitive resin layer 82 is formed on the semiconductor wafer 31 to eliminate a step between the MEMS chip and the semiconductor wafer 31. Therefore, the semiconductor substrate 11 does not need to be thinned by mechanical grinding. Damage to the MEMS chip can be reduced.

Because the resin layers 80 and 81 are subjected to anisotropic etching with the resin film 12 on the rear surface of the MEMS chip as a mask, the front surface of the semiconductor wafer excluding an area shaded by the MEMS chip is exposed with high positional accuracy. Therefore, it is possible to form the electrode pad 33a, which is formed on the semiconductor wafer, near a pole of the MEMS chip without taking into account positionally uncertain spread in forming the resin layer 80 in FIG. 16A.

In the embodiments explained above, the method of mounting one MEMS chip face-down on one IC chip is explained. However, a plurality of MEMS chips may be mounted face-down on one IC chip.

A wafer on which the MEMS chip is mounted face-down is not always limited to an IC wafer and can be an MEMS wafer, a wafer on which only wires are formed, or a wafer on which passive components are formed. The MEMS chip mounted face-down on the IC wafer can be an IC chip including a silicon on insulator (SOI) wafer.

In the MEMS package shown in FIG. 21, the pad electrodes 33a and 33b are formed on the semiconductor wafer 31. The movable section 16 is formed above the insulating film 13. The electrodes 15a and 15b that are electrically connected to the movable section 16 and can supply a driving signal to the movable section 16 when necessary are also formed on the insulating film 13 to form the MEMS chip. The movable section 16 is arranged to be opposed to the semiconductor wafer 31. The electrode 15a and the pad electrode 33b are connected via the protruding electrode 22. The resin layer 82 for eliminating a step between the MEMS chip and the semiconductor wafer 31 is formed on the semiconductor wafer 31 around the MEMS chip. The land electrodes 85a and 85b are formed on the resin layer 82. The land electrode 85b is connected to the rear surface of the electrode 15b via the opening K41 for exposing the rear surface of the electrode 15b. The land electrode 85a is connected to the front surface of the pad electrode 33a via the opening K42 pierced through the resin layer 82.

As a modification of the MEMS package shown in FIG. 21, the insulating films 12 and 13 can be extended to the pad electrode 33a, an isolated electrode, which is opposed to the pad electrode 33a, can be formed on the insulating film 13 separately from the electrodes 15a and 15b, and the isolated electrode and the pad electrode 33a can be connected by a protruding electrode. An opening for exposing the rear surface of the isolated electrode can be formed in the insulating films 12 and 13 and the isolated electrode can be connected to the land electrode 85a via the opening.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. An MEMS package, comprising:
a semiconductor chip on which a semiconductor element and a first pad electrode are formed;
a movable section formed above an insulating layer;
a first resin layer formed on the insulating layer so as to seal the movable section;
first and second electrodes electrically connected to the movable section formed above the insulating layer;
a first protruding electrode formed on the first electrode, the first protruding electrode connecting the first pad electrode and the first electrode; and
a first land electrode connected to a rear surface of the second electrode via a first opening formed in the insulating layer.

2. The MEMS package according to claim 1, further comprising:
   a second pad electrode formed on the semiconductor chip; and
   a second land electrode formed on the first resin layer and connected to the second pad electrode via a through hole pierced through the first resin layer.

3. The MEMS package according to claim 1, further comprising a conductor bump embedded in the through hole.

4. The MEMS package according to claim 2, further comprising:
   a second protruding electrode formed on the first land electrode; and
   a third protruding electrode formed on the second land electrode.

5. The MEMS package according to claim 2, further comprising:
   a first metal pillar formed on the first land electrode;
   a second metal pillar formed on the second land electrode;
   a second resin layer formed on the first land electrode and the second land electrode to cover peripheries of the first metal pillar and the second metal pillar such that upper edges of the first metal pillar and the second metal pillar are exposed;
   a second protruding electrode formed on the first metal pillar; and
   a third protruding electrode formed on the second metal pillar.

6. The MEMS package according to claim 1,
   wherein the first resin layer is filled between the insulating layer and the semiconductor chip around the movable section.

7. The MEMS package according to claim 6,
   wherein the first protruding electrode is buried in the first resin layer.

8. The MEMS package according to claim 7, further comprising:
   a cap layer formed on the insulating layer so as to separate the movable section from the first resin layer, the cap layer being provided on the inner surface of the first resin layer over the movable section.

9. The MEMS package according to claim 8, wherein the insulating layer is wholly buried in the first resin layer with the movable section.

* * * * *